US012658408B2

(12) United States Patent
Kim et al.

(10) Patent No.: US 12,658,408 B2
(45) Date of Patent: Jun. 16, 2026

(54) APPARATUS AND METHOD FOR TREATING SUBSTRATE

(71) Applicant: SEMES CO., LTD., Cheonan-si (KR)

(72) Inventors: Dae Hyun Kim, Seoul (KR); Dong Beom Jang, Cheonan-si (KR)

(73) Assignee: Semes Co., LTD., Cheonan-si (KR)

( * ) Notice: Subject to any disclaimer, the term of this patent is extended or adjusted under 35 U.S.C. 154(b) by 343 days.

(21) Appl. No.: 17/490,350

(22) Filed: Sep. 30, 2021

(65) Prior Publication Data

US 2022/0115209 A1 Apr. 14, 2022

(30) Foreign Application Priority Data

Oct. 13, 2020 (KR) ........................ 10-2020-0131647

(51) Int. Cl.
*H01J 37/32* (2006.01)

(52) U.S. Cl.
CPC .. *H01J 37/32183* (2013.01); *H01J 37/32174* (2013.01); *H01J 37/32577* (2013.01); (Continued)

(58) Field of Classification Search
CPC ........... H01J 37/32091; H01J 37/32137; H01J 37/32146; H01J 37/32174; H01J 37/32183; H01J 37/32385; H01J 37/3244; H01J 37/32522; H01J 37/32577; H01J 37/32642; H01J 37/32697; H01J 37/32706; H01J 37/32715; H01J 37/32724;

(Continued)

(56) References Cited

U.S. PATENT DOCUMENTS 5,747,935 A * 5/1998 Porter .................. H02M 7/537
315/111.21
5,846,883 A * 12/1998 Moslehi ................ H01J 37/321
438/711

(Continued)

FOREIGN PATENT DOCUMENTS

JP 2009-164608 A 7/2009
JP 4985637 B2 7/2012

(Continued)

OTHER PUBLICATIONS

Yomamzawa et al. "Control of the Harmonics Generation in a Capacitively Coupled Plasma Reactor", Jpn. J. Appl. Phys. vol. 46, No. 11, 2007, pp. 7453-7459.

*Primary Examiner* — Kurt Sweely
(74) *Attorney, Agent, or Firm* — Harness, Dickey & Pierce, P.L.C.

(57) ABSTRACT

An apparatus for treating a substrate is disclosed. The apparatus includes a radio frequency (RF) power source to apply an RF signal to excite a process gas to be in a plasma state. A supporting unit to support the substrate includes an edge ring to surround the substrate, a coupling ring disposed under the edge ring and including an electrode in the coupling ring, and an edge impedance control circuit connected with the electrode. The edge impedance control circuit includes a harmonic control circuit unit to control a harmonic generated from the RF power source, an ion flux control circuit unit to adjust an ion flux of an edge region of the substrate, and a cable impedance control circuit unit to adjust an impedance made due to a length of the RF cable.

20 Claims, 6 Drawing Sheets

(52) U.S. Cl.
 CPC .. *H01J 37/32642* (2013.01); *H01J 37/32715* (2013.01); *H01J 37/32091* (2013.01); *H01J 37/3244* (2013.01)

(58) Field of Classification Search
 CPC .......... C23C 16/45565; C23C 16/4557; C23C 16/45572; C23C 16/4583; C23C 16/4585; C23C 16/4586; C23C 16/466; C23C 16/509; C23C 16/5093; H01L 21/67069; H01L 21/6831; H01L 21/6833; H01L 21/68714; H01L 21/68785
 See application file for complete search history.

(56) References Cited

U.S. PATENT DOCUMENTS

| | | | | |
|---|---|---|---|---|
| 7,722,925 | B2 * | 5/2010 | White | H01J 37/3244 |
| | | | | 427/248.1 |
| 9,593,411 | B2 * | 3/2017 | Hoffman | H01J 37/3266 |
| 9,852,889 | B1 * | 12/2017 | Kellogg | H01J 37/32155 |
| 2004/0040931 | A1 * | 3/2004 | Koshiishi | H01J 37/32642 |
| | | | | 156/345.43 |
| 2008/0136560 | A1 * | 6/2008 | Bavisi | H03H 7/0161 |
| | | | | 333/175 |
| 2012/0305191 | A1 * | 12/2012 | Mun | H01J 37/32532 |
| | | | | 156/345.44 |
| 2017/0033760 | A1 * | 2/2017 | Leipold | H03H 7/09 |
| 2018/0102238 | A1 * | 4/2018 | Gu | H01J 37/32174 |
| 2019/0287766 | A1 * | 9/2019 | Jeon | H01J 37/32697 |
| 2019/0304754 | A1 * | 10/2019 | Shim | H01J 37/32642 |
| 2020/0118796 | A1 | 4/2020 | Arakelyan et al. | |
| 2020/0152423 | A1 * | 5/2020 | Nguyen | H01J 37/32174 |
| 2020/0373126 | A1 | 11/2020 | Na et al. | |

FOREIGN PATENT DOCUMENTS

| | | | |
|---|---|---|---|
| JP | 5210905 | B2 | 6/2013 |
| JP | 2015-097197 | A | 5/2015 |
| JP | 2020-096176 | A | 6/2020 |
| KR | 101555888 | B1 | 9/2015 |
| KR | 10-2018-0000291 | A | 1/2018 |
| WO | WO-2011105678 | A1 | 9/2011 |

\* cited by examiner

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2020-0131647 filed on Oct. 13, 2020, in the Korean Intellectual Property Office, the entire contents of which are hereby incorporated by reference.

BACKGROUND

Embodiments of the inventive concept described herein relate to an apparatus and a method for treating a substrate. More particularly, embodiments of the inventive concept described herein relate to an apparatus and a method for treating a substrate, capable of controlling a harmonic component generated in a procedure of treating the substrate while controlling ion directionality for an edge region.

In order to fabricate a semiconductor device, a desired pattern is formed on a substrate through various processes such as, photolithography, etching, ashing, ion implantation, thin film deposition, and cleaning processes. Among them, the etching process, which is to remove a selected heating region from a layer formed on a substrate, includes a wet etching process and a dry etching process. Among them, an etching device employing plasma is used for the dry etching process In general, an electric field is formed in an inner space of a chamber to form the plasma. The electric field excites process gas provided in the chamber to be in a plasma status. The plasma refers to the status of ionized gas containing ions, electrons, and radicals. The plasma is generated due to a significantly high temperature, a strong electric field, or radio frequency electromagnetic fields As the etching process is performed, the direction of the ion flux may be changed in the edge region due to the etching using an edge ring, process uniformity is deteriorated, and the yield rate may be lowered. In addition, a harmonic component generated due to the plasma increases the plasma density in the central region. Accordingly, an irregular etch amount is caused between the central region and an edge region.

According to a conventional process, to solve the problem of changing the direction of the ion flux in the edge region due to the etching using the edge ring, radio frequency (RF) plasma in the edge region is coupled by using the edge ring and a coupling ring disposed under the edge ring, thereby controlling the direction of the ion flux in the edge region by using a variable device included in an RF filter. In this case, an irregular etch amount is caused between the central region and the edge region due to the non-linearity of the plasma sheath. In the conventional design process, harmonic signals, especially, the third harmonic signal is not considered.

SUMMARY

Embodiments of the inventive concept provide an apparatus and a method for treating a substrate, capable of improving etching uniformity and increasing the use time of an etch ring by controlling ion directionality and a harmonic component together.

Embodiments of the inventive concept provide an apparatus and a method for treating a substrate, capable of regulating the difference of etch rate made due to the length difference of an RF cable.

The technical problems to be solved by the inventive concept are not limited to the aforementioned problems, and any other technical problems not mentioned herein will be clearly understood from the following description by those skilled in the art to which the inventive concept pertains.

According to an embodiment, an apparatus for treating a substrate is disclosed.

The apparatus for treating the substrate may include a process chamber having a treatment space in the process chamber, a supporting unit to support the substrate in the treatment space, a gas supplying unit to supply process gas into the treatment space, and an RF power source to apply an RF signal to excite the process gas to be in a plasma state. The supporting unit includes an edge ring to surround the substrate, a coupling ring disposed under the edge ring and including an electrode in the coupling ring, and an edge impedance control circuit connected with the electrode. The electrode may be connected with the edge impedance control circuit through an RF cable. The edge impedance control circuit may include a harmonic control circuit unit to control a harmonic generated from the RF power source, an ion flux control circuit unit to adjust an ion flux of an edge region of the substrate, and a cable impedance control circuit unit to adjust an impedance made due to a length of the RF cable.

According to an embodiment, the harmonic control circuit unit may include a first variable capacitor, the ion flux control circuit unit may include a second variable capacitor, and the cable impedance control circuit unit may include a third variable capacitor.

According to an embodiment, the ion flux control circuit unit may further include at least one band stop filter.

According to an embodiment, the band stop filter may be interposed between the harmonic control circuit unit and the second variable capacitor.

According to an embodiment, the frequency cut off by the band stop filter may be provided in a frequency range for blocking a harmonic signal generated from the RF power source.

According to an embodiment, the harmonic control circuit unit and the ion flux control circuit unit may be connected with each other in parallel.

According to an embodiment, the cable impedance control circuit unit may be connected with the RF cable in series.

According to an embodiment, the cable impedance control circuit unit may be connected with the harmonic control circuit unit in series, and may be connected with the ion flux control circuit unit in parallel.

According to an embodiment, the harmonic control circuit unit may regulate the first variable capacitor to control a third harmonic generated from the RF power source, and the ion flux control circuit unit may regulate the second variable capacitor to uniformly control an ion trajectory by regulating an impedance of the edge ring. The cable impedance control circuit unit may regulate the third variable capacitor to adjust the difference by adjusting the impedance generated due to the length of the RF cable.

According to an embodiment, the harmonic control circuit unit may be disposed to be closer to the electrode than the ion flux control circuit unit, and the cable impedance control circuit unit may be disposed to be closer to the electrode than the harmonic control circuit unit.

According to an embodiment, an insulator interposed between the edge ring and the coupling ring may be further disposed.

According to another embodiment of the inventive concept, an apparatus for treating a substrate is disclosed.

The apparatus may include a process chamber having a treatment space in the process chamber, a supporting unit to support the substrate in the treatment space, a gas supplying unit to supply process gas into the treatment space, and an RF power source to apply an RF signal to excite the process gas to be in a plasma state. The supporting unit includes an edge ring to surround the substrate, a coupling ring disposed under the edge ring and including an electrode in the coupling ring, a harmonic control circuit unit including a first variable capacitor, an ion flux control circuit unit includes a second variable capacitor, and a cable impedance control circuit unit including a third variable capacitor. The ion flux control circuit unit may include at least one band stop filter interposed between the harmonic control circuit unit and the second variable capacitor.

According to an embodiment, an end of the harmonic control circuit unit may be connected with the ground, the harmonic control circuit unit may be connected with the ion flux control circuit unit in parallel.

According to an embodiment, an end of the ion flux control circuit unit may be connected with the ground, and the at least one band stop filter and the second variable capacitor may be connected with each other in series.

According to an embodiment, the at least one band stop filter may set a frequency range to be in a range having no influence of a harmonic by the RF power source, when the ion flux control circuit unit operates.

According to an embodiment, a frequency cut off by the at least one band stop filter may be a third harmonic of the RF power source or the frequency of the RF power source.

According to an embodiment, the harmonic control circuit unit, the ion flux control circuit unit, and the cable impedance control circuit unit may be electrically connected with the electrode.

According to another embodiment of the inventive concept, a method for treating a substrate in an apparatus for treating the substrate, which generates plasma inside a process chamber, by using the apparatus for treating the substrate.

The method may include adjusting a cable difference by regulating the cable impedance control circuit unit, controlling the direction of an ion flux by regulating the ion flux control circuit unit and adjusting the etching rate in the central portion of the substrate by using the harmonic control circuit unit.

According to an embodiment, the controlling of the direction of the ion flux by regulating the ion flux control circuit unit may include cutting of a harmonic by using the band stop filter.

According to an embodiment, the regulating of the cable difference by regulating the cable impedance control circuit unit may include adjusting cable equality by regulating the third variable capacitor, the controlling of the direction of the ion flux by regulating the ion flux control circuit may include controlling the direction of the ion flux by adjusting the second variable capacitor, and the adjusting the etching rate in the central portion of the substrate by using the harmonic control circuit unit may include adjusting the etching rate by regulating the first variable capacitor.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
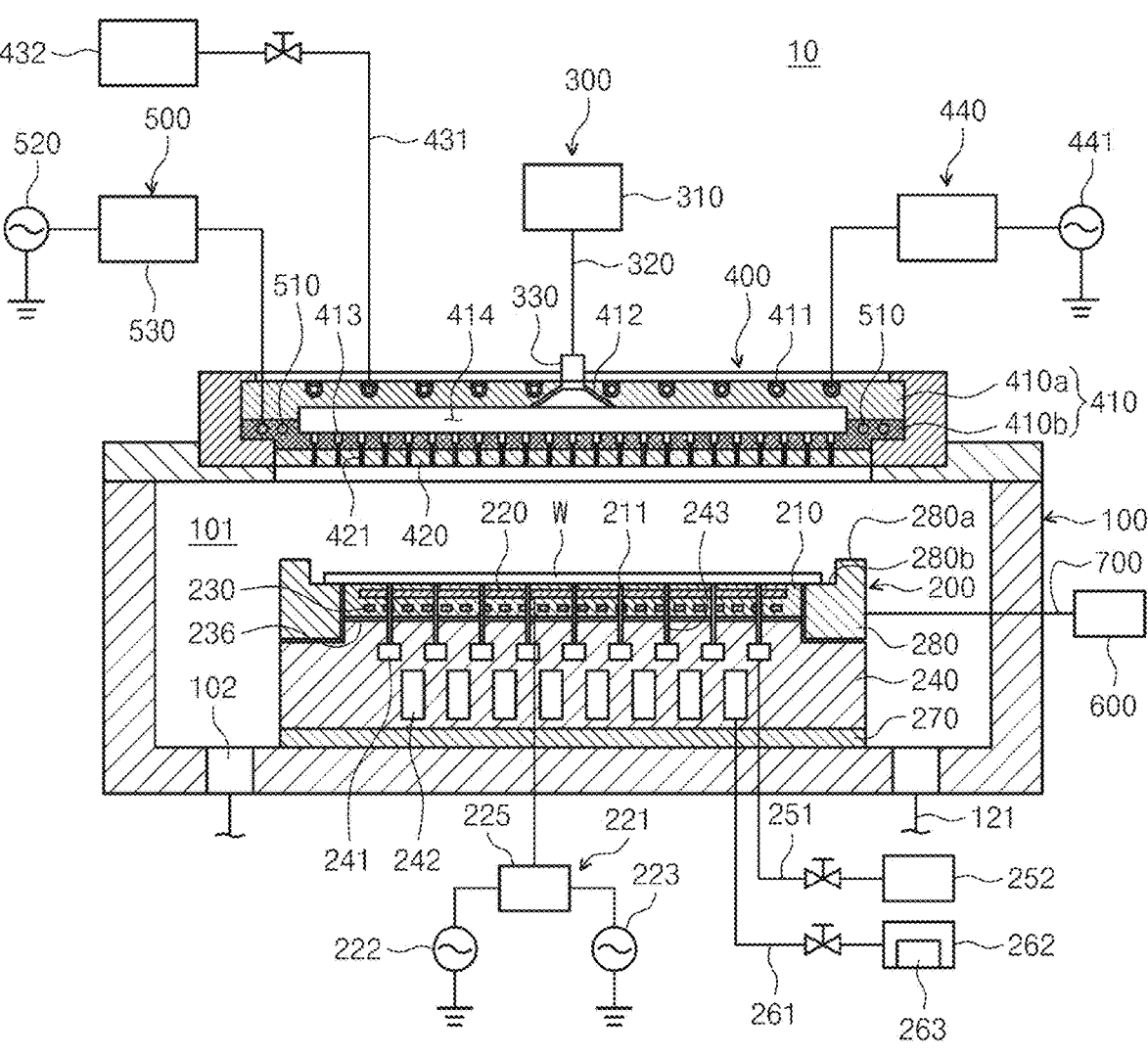
FIG. 1 is a view illustrating an apparatus for treating a substrate, according to an embodiment of the inventive concept.

Advantage points and features of the inventive concept and a method of accomplishing thereof will become apparent from the following description with reference to accompanying drawings and embodiments to be described in detail with reference to the accompanying drawings. However, the inventive concept may be embodied in various different forms, and should not be construed as being limited only to the illustrated embodiments. Rather, these embodiments are provided as examples so that the inventive concept will be thorough and complete, and will fully convey the concept of the inventive concept to those skilled in the art. The inventive concept may be defined by scope of the claims.

Unless otherwise specified, all terms used herein, including technical or scientific terms, have the same meanings as those generally understood by those skilled in the art to which the inventive concept pertains. It will be further understood that terms used herein should be interpreted as having a meaning that is consistent with their meaning in the context of the inventive concept and the relevant art and will not be interpreted in an idealized or overly formal sense unless expressly so defined in the inventive concept The terms used in the inventive concept are provided for the illustrative purpose, but the inventive concept is not limited thereto. As used herein, the singular terms are intended to include the plural forms as well, unless the context clearly indicates otherwise. Furthermore, it will be further understood that the terms "comprises", and/or various modifications, such as "comprising," "includes" and/or "including", when used herein, specify the presence of stated compositions, ingredients, components, steps, operations, and/or elements, but do not preclude the presence or addition of one or more other compositions, ingredients, components, steps, operations, and/or elements. In the inventive concept, the term "and/or" indicates each of associated listed items and include various possible combinations of one or more of the associated listed items.

Although the terms first, second, etc. may be used herein to describe various components, these components should not be limited by these terms. These terms are used to distinguish one component from another component. For example, a first component discussed below could be termed a second component without departing from the technical scope of the inventive concept. Similarly, the second component could be termed the first component.

The singular forms are intended to include the plural forms unless the context clearly indicates otherwise. In addition, the shapes and the sizes of elements in accompanying drawings will be exaggerated for more apparent description.

The terms "unit" and "module" used herein may refer to a software or hardware component, such as field programmable gate array (FPGA) or application specific integrated circuit (ASIC), and are basic components to perform at least one function or operation. The terms "~unit" and "~module" are not limited to software or hardware. The terms "~unit" and "~module" may be configured to be present in a storage medium to be assigned with addresses and may be configured to reproduce one or more processors.

For example, the "~unit" and "~module" may include components, such as software components, object-oriented software components, class components, and task components, processes, functions, properties, procedures, subroutines, program code segments, drivers, firmware, microcodes, circuits, data, database, data structures, tables, arrangements or variables. Functions provided for a component, "~unit", and "~module" may be separately performed by a plurality of components, "~unit", and "~module" and may be integrated with another additional component FIG. 1 is a view illustrating an apparatus 10 for treating a substrate, according to an embodiment of the inventive concept.

Referring to FIG. 1, the apparatus 10 for treating the substrate treats a substrate "W" by using plasma. For example, the apparatus 10 for treating the substrate may perform an etching process with respect to the substrate "W". The apparatus 10 for treating the substrate includes a chamber 100, a substrate supporting unit 200, a gas supplying unit 300, a plasma generating unit 400, and a heating unit 500.

An inner space 101 is formed inside the chamber 100. The inner space 101 may serve as a space to perform plasma process treatment for the substrate "W". The plasma treatment for the substrate "W" includes an etching process. An exhaust hole 102 is formed in the floor of the chamber 100. The exhaust hole 102 is connected with an exhaust line 121. The reaction byproducts produced during the process and the gas staying in the inner space of the chamber 100 may be discharged to the outside through the exhaust line 121. The pressure of the inner space 101 of the chamber 100 may be reduced to specific pressure.

The substrate supporting unit 200 is positioned inside the chamber 100. The substrate supporting unit 200 supports the substrate "W". The substrate supporting unit 200 includes an electrostatic chuck to suction and fix the substrate "W" by using electrostatic chuck. The substrate supporting unit 200 may include a dielectric plate 210, a lower electrode 220, a heater 230, a supporting plate 240, and an insulating plate 270.

The dielectric plate 210 is positioned at an upper portion of the substrate supporting unit 200. The dielectric plate 210 is provided in a disc shape. The substrate "W" may be placed on the dielectric plate 210. The top surface of the dielectric plate 210 has a diameter smaller than a diameter of the substrate "W". Accordingly, an outer portion of the dielectric plate 210 is positioned at an edge of the substrate "W".

A first supplying fluid passage 211 is formed in the dielectric plate 210. The first supplying fluid passage 211 extends from the top surface of the dielectric plate 210 to the bottom surface of the dielectric plate 210. A plurality of first supplying fluid passages 211 are formed while being spaced apart from each other, and serve as passages to supply a medium for transferring heat to the bottom surface of the substrate "W". An additional electrode may be buried in the dielectric plate 210 to suction the substrate "W" onto the dielectric plate 210. A direct current may be applied to the electrode. Electrostatic force may be applied between the electrode and the substrate by the applied current, and the substrate "W" may be suctioned onto the dielectric plate 210 due to the electrostatic force.

The lower electrode 220 is connected with a lower power source 221. The lower power source 221 applies power to the lower electrode 220. The lower power source 221 includes lower radio frequency (RF) power sources 222 and 223 and a lower impedance matching unit 225. A plurality of lower RF power sources 222 and 223 may be provided as illustrated in FIG. 1. Alternatively, only one lower RF power source may be provided. The lower RF power sources 222 and 223 may adjust the density of plasma. The lower RF power sources 222 and 223 may mainly adjust ion bombardment energy. Each of a plurality of the lower RF power sources 222 and 223 may generate power having the frequency ranging from 2 MHz to 20 MHz. The lower impedance matching unit 225 is electrically connected with the lower RF power sources 222 and 223 to match frequency power having mutually different sizes with each other and to apply the matching result to the lower electrode 220.

The heater 230 is electrically connected with an external power source (not illustrated). The heater 230 emits heat by resisting against a current applied thereto from the external power source. The emitted heat is transferred to the substrate "W" through the dielectric plate 210. The substrate "W" is maintained at a specific temperature by the heat emitted from the heater 230. The heater 230 includes a spiral-shaped coil. Heaters 230 may be buried inside the dielectric plate 210.

The supporting plate 240 is positioned under the dielectric plate 210. A bottom surface of the dielectric plate 210 may be bonded to a top surface of the supporting plate 240 by an adhesive agent 236. The supporting plate 240 may include aluminum (Al). The top surface of the supporting plate 240 may be stepped such that the central region of the supporting plate 240 is positioned to be higher than the edge region of the supporting plate 240. The central region of the top surface of the supporting plate 240 has an area corresponding to an area of the bottom surface of the dielectric plate 210, and is bonded to the bottom surface of the dielectric plate 210. The supporting plate 240 includes a first circulation fluid passage 241, a second circulation fluid passage 242, and a second supplying fluid passage 243

The first circulation fluid passage 241 serves as a passage through which the medium for transferring heat circulates. The first circulation fluid passage 241 may be formed in a spiral shape inside the supporting plate 240. Alternatively, the first circulation fluid passage 241 may include ring-shaped fluid passages concentrically arranged with mutually different radiuses. First circulation fluid passages 241 may communicate with each other. The first circulation fluid passages 241 are formed at equal heights The second circulation fluid passage 242 serves as a passage through which a cooling fluid circulates. The second circulation fluid passage 242 may be formed in a spiral shape inside the supporting plate 240. Alternatively, the second circulation fluid passage 242 may include ring-shaped fluid passages concentrically arranged with mutually different radiuses. Second circulation fluid passages 242 may communicate with each other. The second circulation fluid passage 242 has a sectional area greater than a sectional area of the first circulation fluid passage 241. The second circulation fluid passages 242 are formed at equal heights. The second circulation fluid passage 242 may be positioned under the first circulation fluid passage 241.

The second supplying fluid passage 243 is provided to the top surface of the supporting plate 240 while extending upward from the first circulation fluid passage 241. The number of second supplying fluid passages 243 corresponds to the number of first supplying fluid passages 211. The second supplying fluid passage 243 connects the first circulation fluid passage 241 with the first supplying fluid passage 211.

The first circulation fluid passage 241 is connected with a heat transfer medium storing unit 252 through a heat transfer medium supplying line 251. The medium for transferring heat is stored in the heat transfer medium storing unit 252. The medium for transferring heat includes inert gas. According to an embodiment, the medium for transferring heat includes helium (He). The helium (He) gas is supplied to the first circulation fluid passage 241 through the heat transfer medium supplying line 251, and is supplied to the bottom surface of the substrate "W" by sequentially passing through the second supplying fluid passage 243 and the first supplying fluid passage 211. The helium (He) gas serves as the medium from transferring heat, which is received by the substrate "W" from the plasma, to the substrate supporting unit 200. Ion particles contained in the plasma are attracted by electric force formed by the substrate supporting unit 200 to move to the substrate supporting unit 200. In the moving procedure, the ion particles collide with the substrate "W" such that the etching process is performed. Heat is from the substrate "W" while the ion particles collide with the substrate "W". The heat emitted from the substrate "W" is transferred to the substrate supporting unit 200 through the helium gas supplied between the bottom surface of the substrate "W" and the top surface of the dielectric plate 210. Accordingly, the substrate "W" may be maintained at a specific temperature.

The second circulation fluid passage 242 is connected with the cooling fluid storing unit 262 through the cooling fluid supplying line 261. The cooling fluid is stored in the cooling fluid storing unit 262. A cooler 263 may be provided inside the cooling fluid storing unit 262. The cooler 263 cools the cooling fluid to a specific temperature. Alternatively, the cooler 263 may be installed on the cooling fluid supplying line 261. The cooling fluid received in the second circulation fluid passage 242 through the cooling fluid supplying line 261 circulates along the second circulation fluid passage 242 to cool the supporting plate 240. The cooled supporting plate 240 cools the dielectric plate 210 and the substrate "W" together, thereby maintaining the substrate "W" to the specific temperature.

The insulating plate 270 is provided under the supporting plate 240. The insulating plate 270 is provided in size corresponding to the size of the supporting plate 240. The insulating plate 270 is interposed between the supporting plate 240 and a bottom surface of the chamber 100. The insulating substrate 270 includes an insulating material to electrically insulate the supporting plate 240 from the chamber 100.

An edge ring 280 is placed in an edge region of the substrate supporting unit 200. The edge ring 280 is provided in a ring shape and arranged along the circumference of the dielectric plate 210. The edge ring 280 may be stepped such that an outer portion 280a of the top surface of the edge ring 280 is higher than an inner portion 280b of the top surface of the edge ring 280. The inner portion 280b of the top surface of the edge ring 280 is positioned at a height equal to a height of the top surface of the dielectric plate 210. The inner portion 280b of the top surface of the edge ring 280 supports the edge region of the substrate "W", which is positioned at an outer portion of the dielectric plate 210. The outer portion 280a of the edge ring 280 is provided to surround the edge region of the substrate "W". The edge ring 280 expands a region having an electric field such that the substrate "W" is positioned in the central region for plasma. Accordingly, the plasma may be uniformly formed throughout the whole region of the substrate "W" such that each region of the substrate "W" is uniformly etched. A coupling ring (not illustrated) may be disposed under the edge ring 280. The direction of the ion flux and the harmonic component generated from RF power sources 441, 222, and 223 may be controlled through an edge impedance control circuit 600 connected with the coupling ring through an RF cable 700. The details thereof will be described later with reference to FIG. 2.

The gas supplying unit 300 supplies the process gas into the chamber 100. The gas supplying unit 300 includes a gas storage unit 310, a gas supplying line 320, and a gas inlet port 330. The gas supplying unit 320 connects the gas storage unit 310 with the gas inlet port 330 to supply process gas, which is stored in the gas storage unit 320, to the gas inlet port 330. The gas inlet port 330 is connected with gas supplying holes 412 formed in an upper electrode 410.

The plasma generating unit 400 excites the process gas staying in the chamber 100. The plasma generating unit 400 includes the upper electrode 410, a distributing plate 420, and an upper power source 440.

The upper electrode 410 is provided in a disk shape and is positioned on the substrate supporting unit 200. The upper electrode 410 includes an upper plate 410a and a lower plate 410b. The upper plate 410a is provided in a disk shape. The upper plate 410a is electrically connected with the upper RF power source 441. The upper plate 410a applies the first RF power, which is generated from the upper RF power source 441, to the process gas staying in the chamber 100 to excite the process gas. The process gas is excited and converted to be a plasma status. The bottom surface of the upper plate 410a is stepped such that the central region of the bottom surface of the upper plate 410a is positioned to be higher than the edge region of the bottom surface of the upper plate 410a. The gas supplying holes 412 are formed in the central region of the upper plate 410a. The gas supplying holes 412 are connected with the gas inlet port 330 to supply the process gas to a buffer space 414. A cooling fluid passage 411 may be formed inside the upper plate 410a. The cooling fluid passage 411 may be formed in a spiral shape. The cooling fluid passage 411 may include ring-shaped fluid passages concentrically arranged with mutually different radiuses. The cooling fluid passage 411 is connected with the cooling fluid storing unit 432 through the cooling fluid supplying line 431. The cooling fluid is stored in the cooling fluid storing unit 432. The cooling fluid stored in the cooling fluid storing unit 432 is supplied to the cooling fluid passage 411 through the cooling fluid supplying line 431. The cooling fluid cools the upper plate 410a while circulating the cooling fluid passage 411.

The lower plate 410b is positioned under the upper plate 410a. The lower plate 410b is provided in size corresponding to the size the upper plate 410*a*, and is positioned to face the upper plate 410*a*. The top surface of the lower plate 410*b* is stepped such that the central region of the top surface of the lower plate 410*b* is positioned to be lower than the edge region of the top surface of the lower plate 410*b*. The top surface of the lower plate 410*b* is combined with the bottom surface of the upper plate 410*a* to form the buffer space 414. The buffer space 414 is provided as a space in which gas supplied through the gas supplying holes 412 temporarily stays before being supplied into the chamber 100. Gas supplying holes 413 are formed in the central region of the lower plate 410*b*. A plurality of gas supplying holes 413 are formed while being spaced apart from each other by a specific distance. The gas supplying holes 413 are connected with the buffer space 414.

The distributing plate 420 is positioned under the lower plate 410*a*. The distributing plate 420 is provided in a disk shape. Distributing holes 421 are formed in the distributing plate 420. The distributing holes 421 extend from a top surface of the distributing plate 420 to a bottom surface of the distributing plate 420. The number of distributing holes 421 corresponds to the number of gas supplying holes 413. The distributing holes 421 are positioned to correspond to points at which the gas supplying holes 413 are positioned. The process gas staying in the buffer space 414 is uniformly supplied into the chamber 100 through the gas supplying holes 413 and the distributing holes 421.

The upper power source 440 applies RF power to the upper plate 410*a*. The upper power source 440 includes the upper RF power source 441 and a matching circuit 442.

The heating unit 500 heats the lower plate 410*b*. The heating unit 500 includes a heater 510, a second upper power source 520, and a filter 530. The heater 510 is installed inside the lower plate 410*b*. The heater 510 may be provided in an edge region of the lower plate 410*b*. The heater 510 may include a heating coil and may be provided to surround the central region of the lower plate 410*b*. The second upper power source 520 is electrically connected with the heater 510. The second up per power source 520 may generate DC power. Alternatively, the second upper power source 520 may generate AC power. Power having a second frequency, which is generated from the second upper power source 520, is applied to the heater 510 and the heater 510 emits heat by resisting against the applied current. The heat emitted from the heater 510 heats the lower plate 410*b*, and the heated lower plate 410*b* heats the distributing plate 420 positioned under the lower plate 410*b* to a specific temperature. The lower plate 410*b* may be heated to the temperature of 60° C. The filter 530 is electrically connected with the second upper power source 520 and the heater 510, in a section between the second upper power source 520 and the heater 510.

Figure 2:
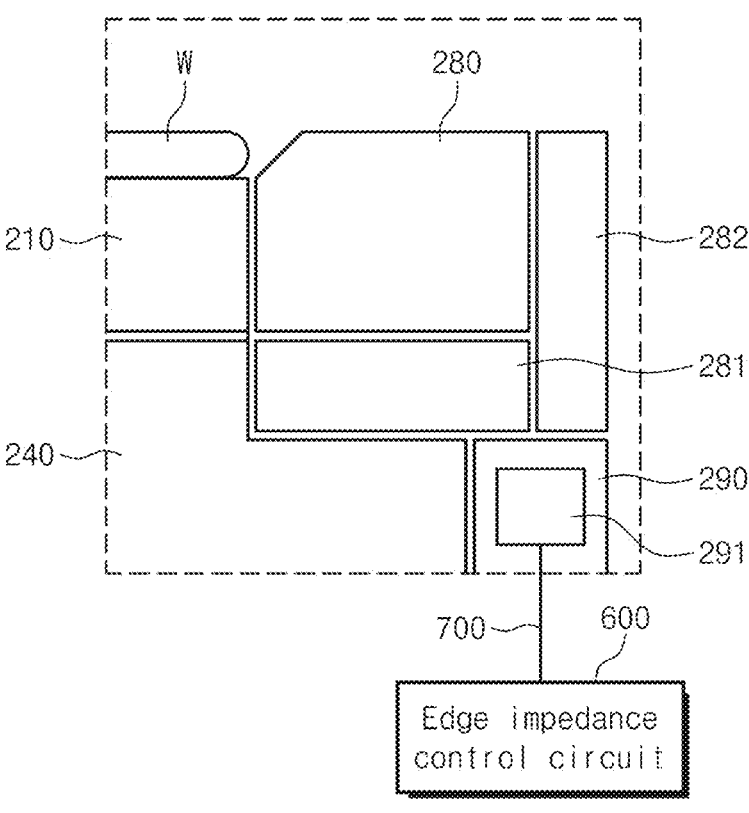
FIG. 2 is an exploded view illustrating an apparatus for treating a substrate, according to an embodiment of the inventive concept.

FIG. 2 is an exploded view illustrating an apparatus for treating a substrate, according to an embodiment of the inventive concept.

According to the inventive concept, the substrate support-ing unit 200 may include the edge ring 280 to surround the substrate "W" and the coupling ring 290 disposed under the edge ring 280. Insulators 281 and 282 may be interposed between the edge ring 280 and the coupling ring 290. Two insulators 281 and 282 may be provided according to an embodiment of FIG. 2. Alternatively, the two insulators 281 and 282 may be integrated with each other and provided in a single form.

An electrode 291 may be included in the coupling ring 290. The edge impedance control circuit 600 may be con-nected with the electrode 291 included in the coupling ring 290. The edge impedance control circuit 600 and the electrode 291 included in the coupling ring 290 may be electri-cally connected with each other through the RF cable 700. The edge impedance control circuit 600 may provide, for an RF signal received in the edge region of the substrate "W", an impedance path to the ground The RF signal may flow to the electrode 291 through a capacitor between the edge ring 280 and the electrode 291. The RF electrode 291 may output the RF signal.

Referring to FIG. 2, variable devices included in the edge impedance control circuit 600 are controlled to control the impedance produced due to a length difference of an RF cable, to control the direction of the ion flux of the edge region of the substrate, and to control the harmonic com-ponent generated from a plasma sheath. The harmonic component controlled by the edge impedance control circuit 600 may be a harmonic component having the frequency of 100 MHz or more. This is because the frequency of 100 MHz or more exerts a greater influence on the concentration of the plasma density in the central region.

As the edge impedance control circuit 600 according to the inventive concept is employed, the direction of the ion flux in the edge region, and the harmonic component gen-erated from the plasma sheath are controlled together, thereby improving the etching uniformity. Accordingly, the inventive concept may resolve the conventional problem of the etching irregularity caused by the harmonic component generated when only the ion flux in the edge region is considered. In addition, the difference of etch rate made due to the length difference of an RF cable may be controlled.

Conventionally, even though the difference in etch amount in the central region and the edge region is made between the equipment and the equipment, as the harmonic component having the frequency of 100 MHz or more is increased or decreased due to the difference of impedance made by the RF cable connected with the electrode 291 inside the coupling ring and the edge impedance control circuit connected with the cable. According to the inventive concept, the edge impedance control circuit 600 includes a harmonic control circuit unit 610 to control a harmonic component and an ion flux control circuit unit 620, thereby controlling the direction of the ion flux in the edge region, and the harmonic component together. In addition, accord-ing to the inventive concept, the edge impedance control circuit 600 includes a cable impedance control circuit unit 630 to correct an impedance difference caused by the length difference of a cable. Accordingly, the difference between equipment and equipment caused by the length difference may be corrected.

Performance or impedance is varied depending on even the length of the RF cable. Accordingly, when RF cables having different lengths are provided for equipment and equipment, the difference in the length between the RF cables exerts an influence on the impedance control result. According to the inventive concept, the difference between equipment and equipment may be removed by controlling the impedance through the cable impedance control circuit unit 630.

Hereinafter, the edge impedance control circuit 600 will be described in more detail with reference to FIGS. 3 and 4, according to an embodiment.

Figure 3:
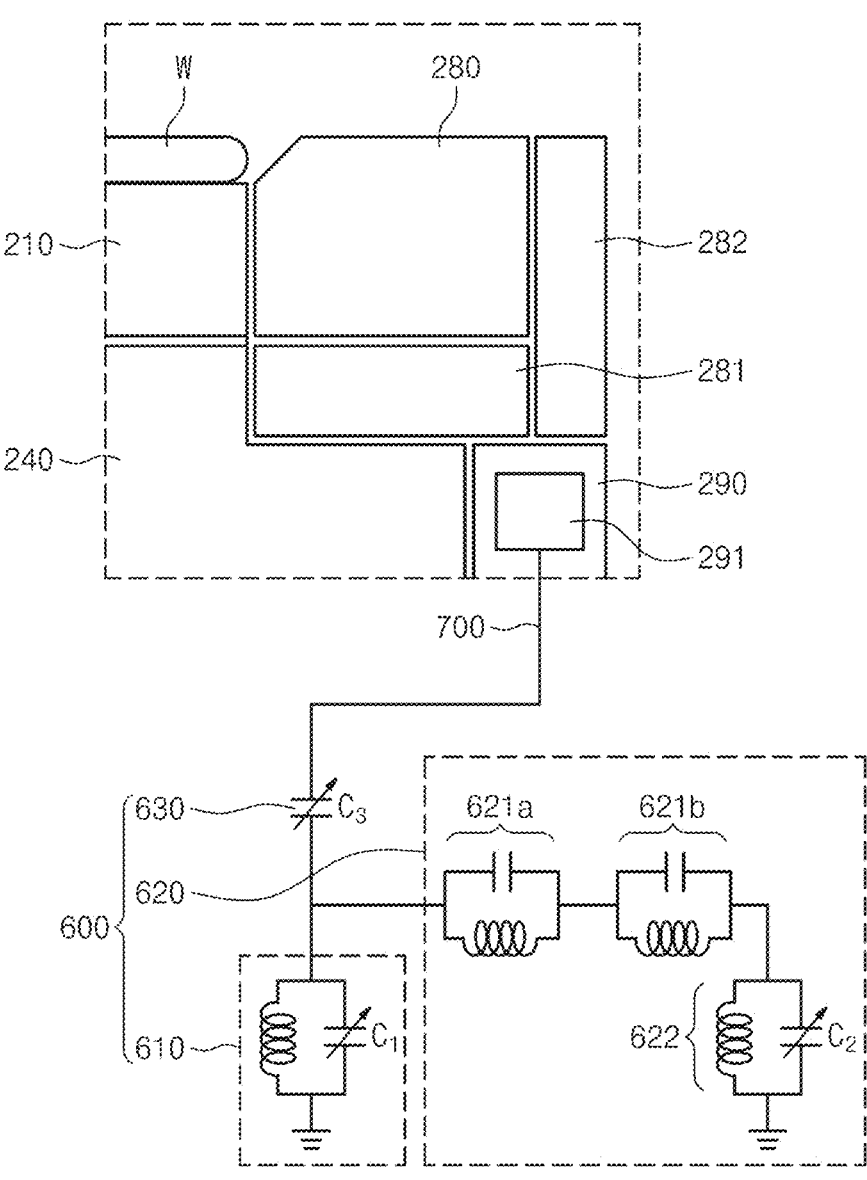
FIG. 3 is a view illustrating an edge impedance control circuit, according to an embodiment of the inventive concept.

FIG. 3 is a view illustrating the edge impedance control circuit 600, according to an embodiment of the inventive concept.

In the following description made with reference to FIG. 3, the duplicated description of the same components as those in FIG. 2 will be omitted.

Referring to FIG. 3, the edge impedance control circuit 600 may include the harmonic control circuit unit 610, the ion flux control circuit unit 620, and the cable impedance control circuit unit 630. The harmonic control circuit unit 610 may include a first variable capacitor $C_1$. The ion flux control circuit unit 620 may include a second variable capacitor $C_2$. The ion flux control circuit unit 620 may include one or more band stop filters 621a and 621b. The band stop filters 621a and 621b may cut off a specific frequency range. The frequency range cut off by the band stop filters 621a and 621b may be a harmonic component of the RF power. The band stop filters 621a and 621b may be notch filters. According to an embodiment made with reference to FIG. 3, the band stop filters 621a and 621b may have the structures in which capacitors and inductors are connected with each other in parallel. However, the structures are provided for the illustrative purpose, reactance devices constituting the band stop filters 621a and 621b may be provided in various combination forms.

The cable impedance control circuit unit 630 may include a third variable capacitor $C_3$. The harmonic control circuit unit 610 may be connected with the ion flux control circuit unit 620 in parallel. One end of the harmonic control circuit unit 610 may be connected with the ground, and an opposite end of the harmonic control circuit unit 610 may be connected with one or more band stop filters 621a in parallel. The opposite end of the harmonic control circuit unit 610 may be connected with the cable impedance control circuit unit 630 in series. An end of the ion flux control circuit unit 620 may be connected with the ground, and a circuit unit 622, which includes the second variable capacitor $C_2$ and is included in the ion flux control circuit unit 620, may be connected with the one or more band stop filter 621b in series.

According to an embodiment, the cable impedance control circuit unit 630 may be connected with the RF cable 700. According to an embodiment, the cable impedance control circuit unit 630 may be connected with the harmonic control circuit unit 610 in series, and connected with the ion flux control circuit unit 620 in parallel.

According to an embodiment, when the frequency of the RF power source is $f_1$ MHz, the frequencies of harmonic components have $f_2$ ($f_1 \times 2$) MHz, $f_3$ ($f_1 \times 3$) MHz, and $f_4$ ($f_1 \times 4$) which are integer multiples of $f_1$ MHz. In this case, $f_1$ may be 100 MHz or more, and the frequencies of the harmonic components may be 100 MHz or more.

According to an embodiment illustrated in FIG. 3, the band stop filters 621a and 621b may be provided by connecting two filters in series. Each of the band stop filters 621a and 621b may cut off a harmonic component generated from the plasma sheath. According to an embodiment, when the frequencies generated from the RF power source are $f_b$ KHz and $f_1$ MHz, the values of a capacitor and an inductor may be set to be in a range for cutting off $f_1$ MHz and $f_3$ MHz (third harmonic component of $f_1$ MHz) in a band stop filter 621. In this case, $f_b$ KHz is a bias frequency for controlling the directionality of the edge ion flux, and is a frequency controlled by the second variable capacitor $C_2$ of the ion flux control circuit unit 620. The influence by the third harmonic component of $f_1$ MHz, which serves as a source frequency, is stronger than the influence by the second harmonic component of $f_1$ MHz. Accordingly, when two band stop filters 621a and 621b are included, the range for cutting off the band stop filters 621a and 621b may be set to the range for cutting off the source frequency and the third harmonic component. According to an embodiment, the frequency range cut off by the band stop filters 621a and 621b may be primarily the harmonic component of the RF power source. In this case, the harmonic component may be 100 MHz or more.

However, when three or more band stop filters are included, even a band stop filter providing the range for cutting off the second harmonic frequency may be included, and even a band stop filter providing the range for cutting off a fourth harmonic component may be included. The details thereof will be described later in detail with reference to FIG. 4.

According to the inventive concept, the band stop filter 621 to remove a harmonic component is implemented in the ion flux control circuit unit 620, such that the characteristic of the $f_3$ MHz frequency of the chamber is not changed when controlling the directionality of the ion flux. The implementation of the band stop filter 621 may prevent the etching rate at the central region from being changed due to the change in the characteristic of the third harmonic frequency ($f_3$ MHz) of the source frequency ($f_1$ MHz) when controlling the directionality of the ion flux.

According to embodiment, referring to FIG. 3, the harmonic control circuit unit 610 may include a first variable capacitor $C_1$, and an inductor connected with the first variable capacitor $C_1$ in parallel. According to embodiment, referring to FIG. 3, the ion flux control circuit unit 620 may include a second variable capacitor $C_2$, and an inductor connected with the second variable capacitor $C_2$ in parallel. According to embodiment, referring to FIG. 3, the cable impedance control circuit unit 630 may include a third variable capacitor $C_3$. However, the inventive concept is not limited thereto, and the detailed components of the harmonic control circuit unit 610 and the ion flux control circuit unit 620 may different from components illustrated in FIG. 3.

According to an embodiment, an $f_B$ KHz impedance of the edge ring 280 is changed by regulating the second variable capacitor $C_2$ included in the flux control circuit unit 620 of the edge impedance control circuit 600, thereby controlling the direction of the ion flux. According to an embodiment, the $f_B$ KHz may be an impedance value in the edge ring 280. The value of the second variable capacitor $C_2$ may be adjusted depending on the etching degree of the edge ring 280. The detailed value of the second variable capacitor $C_2$ may be empirically determined by data including the relationship between the use time of the edge ring 280 and the etching degree. The ion flux may be vertically incident onto the edge ring 280 by regulating the value of the second variable capacitor $C_2$. The $f_3$ MHz component generated from the plasma is regulated by regulating the first variable capacitor $C_1$ included in the harmonic control circuit unit 610, thereby adjusting the etching rate in the vicinity of the central region. The detailed value of the first variable capacitor $C_1$ may be empirically determined by data on the etching rate in the vicinity of the center region and data on the relationship with the capacitor. In addition, when the second variable capacitor $C_2$ is regulated by using one or more band stop filters 621a and 621b included in the ion flux control circuit unit 620, an influence of the harmonic component generated from the chamber 100 may be removed and only an impedance component at a lower frequency is adjustable.

According to an embodiment, when one or more band stop filters 621a and 621b are included in the ion flux control circuit unit 620, the band stop filter 621a cutting off a frequency, which exerts a greater influence, of in a frequency band cut off by the band stop filters 621a and 621b may be disposed closer to the electrode 291. This is because the ion flux control circuit unit 620 is insensitive due to a lower frequency when controlling the direction of the ion flux, but the harmonic control circuit unit 610 is sensitive due to a higher frequency because of controlling a harmonic.

The edge impedance control circuit 600 of FIG. 3 couples a plasma RF signal in the edge region by using the edge ring 280 and the coupling ring 290, and the direction of the ion flux in the edge region may be controlled by regulating the second variable capacitor $C_2$ included in the ion flux control circuit unit 620 of the edge impedance control circuit 600. The edge impedance control circuit 600 of FIG. 3 may control a harmonic plasma density through the harmonic control circuit unit 610, thereby improving the etching uniformity. According to an embodiment, the harmonic frequency controlled through the harmonic control circuit unit 610 may be the third harmonic frequency.

According to the inventive concept, the cable impedance control circuit unit 630 may uniformly regulate an impedance of 60 M, 120 M, or 180 M, which is made due to the length difference of the RF cable 700, between equipment and equipment and remove the difference between the equipment and the equipment. According to the inventive concept, the cable impedance control circuit unit 630 may regulate an impedance of a harmonic frequency (of 60 M or more), which are made due to the length difference of the RF cable 700, thereby uniformly maintaining the voltage between the equipment and the equipment, which is to be applied to the electrode, such that the process variation between the equipment and the equipment may be removed. The cable impedance control circuit unit 630 may be connected with the RF cable 700 in series to directly control the impedance of the RF cable 700.

Conventionally, the direction of the ion flux in the edge region is controlled without considering the third harmonic component of $f_1$ MHz. Accordingly, as the ion flux in the edge region is adjusted by using a variable device, an amount of harmonic component generated from the plasma may be changed, thereby causing the change in the etching rate during the process. According to the inventive concept, an amount of a harmonic component ($f_3$ MHz) is adjusted by using a variable device included in the harmonic control circuit unit 610, thereby controlling the change in the etching rate during the process. FIG. 4 is a view illustrating the edge impedance control circuit 600, according to an embodiment of the inventive concept.

Figure 4:
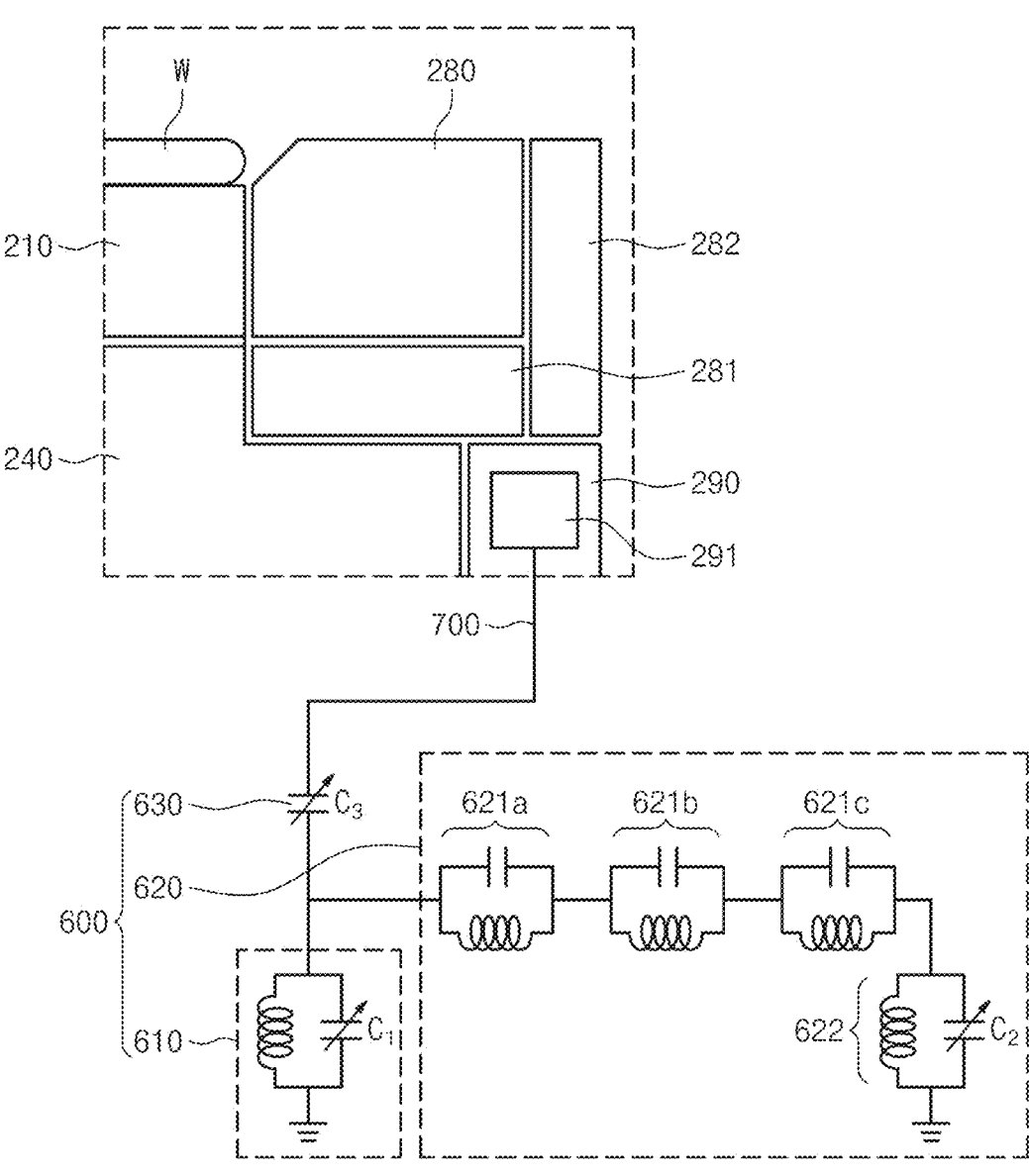
FIG. 4 is a view illustrating an edge impedance control circuit, according to another embodiment of the inventive concept.

The edge impedance control circuit 600 according to an embodiment in FIG. 4 may further include one band stop filter 621c, when compared to the configuration of FIG. 3.

According to the embodiment in FIG. 4, a total of three band stop filters 621a, 621b, and 621c may be included. A harmonic component generated from the plasma may be additionally cut off in various ranges by using an additional band stop filter 621c. According to the embodiment in FIG. 4, the three band stop filters 621a, 621b, and 621c may provide the basic frequency of $f_1$ MHZ, which is generated from the RF power source, the second harmonic frequency of the basic frequency, and the third harmonic frequency of the basic frequency, in a frequency range that are able to be cut off. In this case, the band stop filters 621a, 621b, and 621c may be arranged such that a band stop filter having a greater harmonic frequency influence is closer to the electrode 291.

Figure 5:
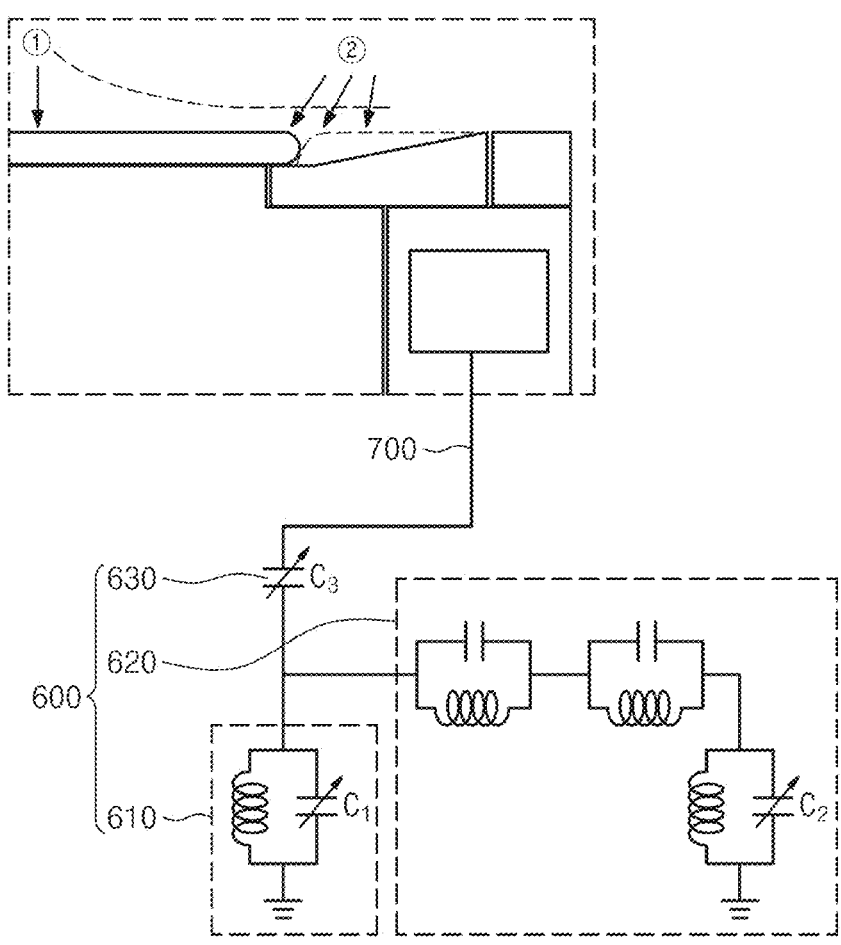
FIG. 5 is a view illustrating the result from the use of an edge impedance control circuit, according to an embodiment of the inventive concept.

FIG. 5 is a view illustrating the result from the use of an edge impedance control circuit 600, according to an embodiment of the inventive concept.

Referring to FIG. 5, the plasma density at the central portion of the substrate "W" may be increased due to the effect of the third harmonic frequency ($f_3$ MHz) of the power source. In addition, an edge distortion may be caused at the edged part due to the change in an ion trajectory of the bias ($f_b$ KHz).

The problems shown in FIG. 5 may be solved by the edge impedance control circuit 600 according to the inventive concept. A center peak phenomenon appeared as illustrated in reference sign ① may be controlled to be reduced by the harmonic control circuit unit 610 of the edge impedance control circuit 600, and the ion directionality may be controlled through the ion flux control circuit unit 620 of the edge impedance control circuit 600 to decrease the etching rate of the edge ring 280 as in reference sign ②.

Figure 6:
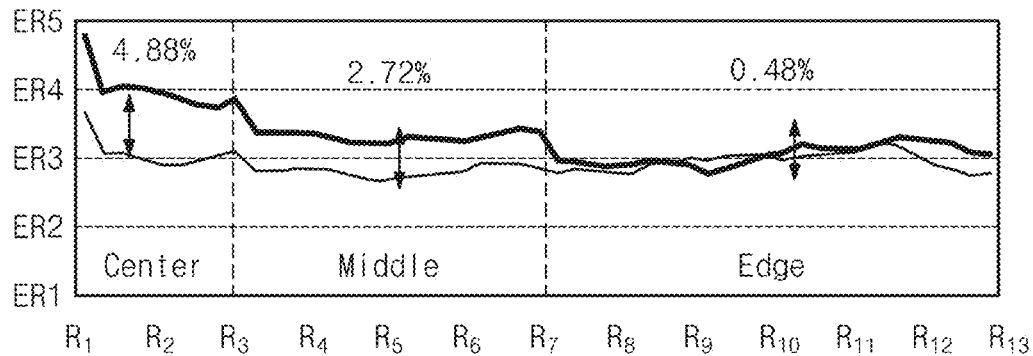
FIG. 6 is a graph illustrating the comparison between the result from the use of an edge impedance control circuit according to an embodiment of the inventive concept, and a conventional result.

FIG. 6 is a graph illustrating the comparison between the result from the use of the edge impedance control circuit 600, according to an embodiment of the inventive concept, and a conventional result.

It may be recognized from FIG. 6 that the center peak phenomenon is remarkably reduced when compared to a conventional technology. The ion directionality in the edge region and the plasma density in the central region may be controlled together by using the edge impedance control circuit 600 according to the inventive concept. According to the inventive concept, the ion directionality may be controlled in the edge region to increase the use time to three times when compared to the conventional technology. In addition, according to the inventive concept, the plasma density is controlled in the central region to remarkably reduce the replacement of the RF cables.

Figure 7:
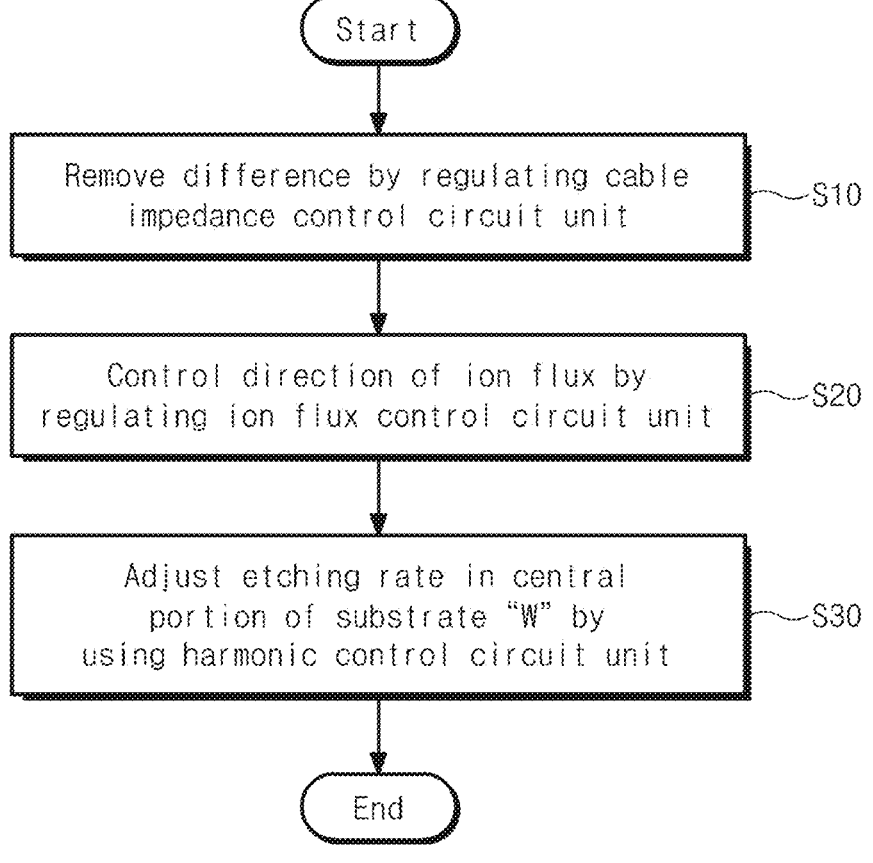
FIG. 7 is a flowchart illustrating a method for treating a substrate, according to an embodiment of the inventive concept.

FIG. 7 is a flowchart illustrating a method for treating a substrate, according to an embodiment of the inventive concept.

Referring to FIG. 7, according to an embodiment of the inventive concept, the method for treating the substrate "W" may include removing difference of etch rate between equipment and equipment by regulating the cable impedance control circuit unit 630 (S10), controlling the direction of an ion flux by regulating the ion flux control circuit unit 620 (S20), and adjusting the etching rate in the central portion of the substrate "W" by using the harmonic control circuit unit 610 (S30). In removing the difference between equipment and equipment by regulating the cable impedance control circuit unit 630 (S10), the difference of etch rate between equipment and equipment made due to the length difference of a cable may be removed by regulating a third variable capacitor. In controlling the direction of an ion flux by regulating the ion flux control circuit unit 620 (S20), the harmonic component may be cut off by using the band stop filter 621 to prevent the influence of the harmonic component, which is exerted due to the non-linearity of the plasma sheath. In this case, the cut-off harmonic frequency may be a harmonic frequency of 100 MHz or more. The direction of the ion flux may be controlled by regulating the second variable capacitor $C_2$, in controlling the direction of the ion flux by regulating the ion flux control circuit unit 620 (S20), and the etching rate may be adjusted by regulating the first variable capacitor $C_1$ in adjusting the etching rate in the central portion of the substrate "W" by using the harmonic control circuit unit 610 (S30).

According to the inventive concept, the ion directionality and the third harmonic component may be controlled together, such that the etching uniformity is improved.

According to the inventive concept, costs may be saved by increasing the use time of the etch ring.

According to the inventive concept, the difference between equipment and equipment may be reduced by regulating the difference made due to length difference of an RF cable.

The effects produced in the inventive concept are not limited to the aforementioned effects, and any other effects not mentioned herein will be clearly understood from the detailed description and accompanying drawings by those skilled in the art to which the inventive concept pertains.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative. Accompanying drawings provided in the inventive concept show the best mode of the inventive concept. Accordingly, the technical scope of the inventive concept is not limited to the detailed description of this specification, but should be defined by the claims. It should be understood that the technical protection scope of the inventive concept is not limited to the literary description of the claims itself, but actually the technical value extends even to the inventive concept of the equal scope.

What is claimed is:

1. An apparatus for treating a substrate, the apparatus comprising:
   a control unit including a processor and a non-transitory storage medium including instructions executable by the processor;
   a process chamber having a treatment space in the process chamber;
   a supporting unit configured to support the substrate in the treatment space;
   a gas supplying unit configured to supply process gas into the treatment space; and
   a radio frequency (RF) power source to configured to apply an RF signal to excite the process gas to be in a plasma state,
   wherein the supporting unit includes:
   an edge ring surrounding the substrate;
   a coupling ring disposed under the edge ring and including an electrode in the coupling ring; and
   an edge impedance control circuit connected with the electrode,
   wherein the electrode is connected with the edge impedance control circuit through an RF cable,
   wherein the edge impedance control circuit includes:
   a harmonic control circuit unit configured to be operated by the control unit to control an etch rate at a center region of the substrate by controlling a harmonic signal generated from the RF power source;
   an ion flux control circuit unit configured to adjust a directionality of an ion flux to control an etch uniformity at an edge region of the substrate; and
   a cable impedance control circuit unit configured to adjust an impedance made due to a length of the RF cable,
   wherein the harmonic control circuit unit includes a first variable capacitor, the ion flux control circuit unit includes a second variable capacitor, and the cable impedance control circuit unit includes a third variable capacitor,
   wherein a first end of the cable impedance control circuit unit is connected to the RF cable,
   wherein the harmonic control circuit unit and the ion flux control circuit unit are connected to each other in parallel between a second end of the cable impedance control circuit unit and a ground,
   wherein the ion flux control circuit unit further includes at least one band stop filter, wherein the at least one band stop filter is interposed between the harmonic control circuit unit and the second variable capacitor,
   wherein a frequency cut off by the at least one band stop filter is in a frequency range associated with blocking the harmonic signal generated from the RF power source, and
   wherein the cable impedance control circuit unit is configured to regulate an impedance of 60 MHz, 120 MHz, or 180 MHz by regulating the third variable capacitor to adjust a difference of etch rate by adjusting the impedance generated due to the length of the RF cable.

2. The apparatus of claim 1, wherein the cable impedance control circuit unit is connected with the RF cable in series.

3. The apparatus of claim 1, wherein
   the harmonic control circuit unit is configured to regulate the first variable capacitor to control a third harmonic generated from the RF power source,
   the ion flux control circuit unit is configured to regulate the second variable capacitor to uniformly control an ion trajectory by regulating an impedance of the edge ring.

4. The apparatus of claim 3, wherein
   the harmonic control circuit unit is closer to the electrode than the ion flux control circuit unit, and
   the cable impedance control circuit unit is closer to the electrode than the harmonic control circuit unit.

5. The apparatus of claim 4, further comprising:
   an insulator interposed between the edge ring and the coupling ring.

6. The apparatus of claim 1, wherein
   the ion flux control circuit unit is configured be operated by the control unit in the adjusting the directionality of the ion flux to control the etch uniformity at the edge region of the substrate.

7. The apparatus of claim 1, wherein
   the cable impedance control circuit unit is configured be operated by the control unit in the adjusting the impedance due to the length of the RF cable.

8. An apparatus for treating a substrate, the apparatus comprising:
   a control unit including a processor and a non-transitory storage medium including instructions executable by the processor;
   a process chamber having a treatment space in the process chamber;
   a supporting unit configured to support the substrate in the treatment space;
   a gas supplying unit configured to supply process gas into the treatment space; and
   an RF power source configured to apply an RF signal to excite the process gas to be in a plasma state,
   wherein the supporting unit includes:
   an edge ring configured to surround the substrate;
   a coupling ring under the edge ring and including an electrode in the coupling ring;
   a harmonic control circuit unit including a first variable capacitor;
   an ion flux control circuit unit including a second variable capacitor; and
   a cable impedance control circuit unit including a third variable capacitor,
   wherein the ion flux control circuit unit includes:
   at least one band stop filter interposed between the harmonic control circuit unit and the second variable capacitor, wherein the electrode is connected with the harmonic control circuit unit, the ion flux control circuit unit, and the cable impedance control circuit unit through an RF cable, wherein the harmonic control circuit unit is configured to be operated by the control unit to control an etch rate at a center region of the substrate by controlling a harmonic signal generated from the RF power source, wherein the ion flux control circuit unit is configured to adjust a directionality of an ion flux to control an etch uniformity at an edge region of the substrate, wherein the cable impedance control circuit unit is configured to adjust an impedance made due to a length of the RF cable, wherein a first end of the cable impedance control circuit unit is connected to the RF cable, wherein the harmonic control circuit unit and the ion flux control circuit unit are connected to each other in parallel between a second end of the cable impedance control circuit unit and a ground, wherein a frequency cut off by the at least one band stop filter is in a frequency range associated with blocking the harmonic signal generated from the RF power source, and wherein the cable impedance control circuit unit is configured to regulate an impedance of 60 MHz, 120 MHz, or 180 MHz by regulating the third variable capacitor to adjust a difference of etch rate by adjusting the impedance generated due to the length of the RF cable.

9. The apparatus of claim 8, wherein an end of the ion flux control circuit unit is connected with the ground, and the at least one band stop filter and the second variable capacitor are connected with each other in series.

10. The apparatus of claim 9, wherein the cable impedance control circuit unit is connected with the RF cable in series.

11. The apparatus of claim 8, wherein the frequency cut off by the at least one band stop filter is a third harmonic of the RF power source or a frequency of the RF power source.

12. The apparatus of claim 11, wherein the harmonic control circuit unit, the ion flux control circuit unit, and the cable impedance control circuit unit are electrically connected with the electrode.

13. The apparatus of claim 12, wherein the harmonic control circuit unit is disposed to be closer to the electrode than the ion flux control circuit unit, and the cable impedance control circuit unit is disposed to be closer to the electrode than the harmonic control circuit unit.

14. The apparatus of claim 13, further comprising:

an insulator interposed between the edge ring and the coupling ring.

15. An apparatus for treating a substrate, the apparatus comprising:

a control unit including a processor and a non-transitory storage medium including instructions executable by the processor;

a process chamber having a treatment space in the process chamber;

a supporting unit configured to support the substrate in the treatment space;

a gas supplying unit configured to supply process gas into the treatment space; and a radio frequency (RF) power source to configured to apply an RF signal to excite the process gas to be in a plasma state, wherein the supporting unit includes:

an edge ring surrounding the substrate;

a coupling ring disposed under the edge ring and including an electrode in the coupling ring; and an edge impedance control circuit connected with the electrode, wherein the electrode is connected with the edge impedance control circuit through an RF cable, wherein the edge impedance control circuit includes:

a harmonic control circuit unit configured to be operated by the control unit to control an etch rate at a center region of the substrate by controlling a harmonic signal generated from the RF power source;

an ion flux control circuit unit configured to adjust a directionality of an ion flux to control an etch uniformity at an edge region of the substrate; and a cable impedance control circuit unit configured to adjust an impedance made due to a length of the RF cable, wherein the harmonic control circuit unit includes a first variable capacitor, the ion flux control circuit unit includes a second variable capacitor, and the cable impedance control circuit unit includes a third variable capacitor, and wherein the cable impedance control circuit unit is configured to regulate an impedance of 60 MHz or higher by regulating the third variable capacitor to adjust a difference of etch rate by adjusting the impedance generated due to the length of the RF cable.

16. The apparatus of claim 15, wherein a first end of the cable impedance control circuit unit is connected to the RF cable.

17. The apparatus of claim 16, wherein the harmonic control circuit unit and the ion flux control circuit unit are connected to each other in parallel between a second end of the cable impedance control circuit unit and a ground.

18. The apparatus of claim 17, wherein the ion flux control circuit unit further includes at least one band stop filter.

19. The apparatus of claim 18, wherein the at least one band stop filter is interposed between the harmonic control circuit unit and the second variable capacitor.

20. The apparatus of claim 19, wherein a frequency cut off by the at least one band stop filter is in a frequency range associated with blocking the harmonic signal generated from the RF power source.

* * * * *